United States Patent
Fujiya et al.

(10) Patent No.: US 10,862,450 B2
(45) Date of Patent: Dec. 8, 2020

(54) ELASTIC WAVE DEVICE

(71) Applicant: Murata Manufacturing Co., Ltd., Nagaokakyo (JP)

(72) Inventors: Masaharu Fujiya, Nagaokakyo (JP); Kazushi Watanabe, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 47 days.

(21) Appl. No.: 16/234,686

(22) Filed: Dec. 28, 2018

(65) Prior Publication Data

US 2019/0140615 A1 May 9, 2019

Related U.S. Application Data

(63) Continuation of application No. PCT/JP2017/023651, filed on Jun. 27, 2017.

(30) Foreign Application Priority Data

Jun. 29, 2016 (JP) .................. 2016-129077

(51) Int. Cl.
*H03H 9/64* (2006.01)
*H03H 9/72* (2006.01)
(Continued)

(52) U.S. Cl.
CPC ................ *H03H 9/08* (2013.01); *H03H 3/08* (2013.01); *H03H 9/02559* (2013.01);
(Continued)

(58) Field of Classification Search
CPC .................................................. H03H 9/64–72
See application file for complete search history.

(56) References Cited

U.S. PATENT DOCUMENTS 7,332,986 B2 * 2/2008 Koga ................... H03H 9/0576
310/313 B
8,004,370 B2 * 8/2011 Yamagata .......... H03H 9/02944
333/133
(Continued)

FOREIGN PATENT DOCUMENTS

JP 2001-281478 A 10/2001
JP 2003-087093 A 3/2003
(Continued)

OTHER PUBLICATIONS

Official Communication issued in International Patent Application No. PCT/JP2017/023651, dated Sep. 5, 2017.
(Continued)

*Primary Examiner* — Dean O Takaoka
*Assistant Examiner* — Alan Wong
(74) *Attorney, Agent, or Firm* — Keating & Bennett, LLP

(57) ABSTRACT

An elastic wave device includes a substrate, an elastic wave element, and an exterior resin layer. The substrate includes an outer electrode on one main surface thereof and a first mounting electrode on another main surface thereof. The elastic wave element includes a piezoelectric substrate, a transmission functional electrode, a reception functional electrode, and ground terminals on one main surface of the piezoelectric substrate, and the ground terminals are connected to the first mounting electrode. High-thermal-conductivity conductor layers are provided on another main surface of the piezoelectric substrate, conductor vias penetrate between both main surfaces of the piezoelectric substrate, and the high-thermal-conductivity conductor layers and the ground terminals are connected to each other by the conductor vias.

17 Claims, 7 Drawing Sheets

(51) Int. Cl.
  *H03H 9/08*   (2006.01)
  *H04B 1/38*   (2015.01)
  *H03H 9/05*   (2006.01)
  *H03H 9/10*   (2006.01)
  *H03H 9/25*   (2006.01)
  *H03H 3/08*   (2006.01)
  *H03H 9/02*   (2006.01)
  *H03H 9/145*  (2006.01)

(52) U.S. Cl.
  CPC ........ *H03H 9/02913* (2013.01); *H03H 9/059* (2013.01); *H03H 9/0576* (2013.01); *H03H 9/1078* (2013.01); *H03H 9/1085* (2013.01); *H03H 9/145* (2013.01); *H03H 9/25* (2013.01); *H03H 9/6489* (2013.01); *H03H 9/725* (2013.01); *H04B 1/38* (2013.01)

(56) References Cited

U.S. PATENT DOCUMENTS

| | | | | |
|---|---|---|---|---|
| 8,076,827 B2* | 12/2011 | Saitou | ................... | H03H 9/059 310/344 |
| 8,125,788 B2* | 2/2012 | Hatanaka | ............ | H03H 9/0542 361/764 |
| 9,887,686 B2* | 2/2018 | Kuwahara | .............. | H03H 9/725 |
| 10,264,677 B2* | 4/2019 | Kawasaki | ................ | H05K 3/30 |
| 10,601,399 B2* | 3/2020 | Kawasaki | .......... | H03H 9/02834 |
| 2005/0176380 A1 | 8/2005 | Okabe et al. | | |

FOREIGN PATENT DOCUMENTS

| | | | |
|---|---|---|---|
| JP | 2004-129088 A | | 4/2004 |
| JP | 2005094405 A | | 4/2005 |
| JP | 2005-217670 A | | 8/2005 |
| JP | 2005217670 A | * | 8/2005 |
| JP | 2005223582 A | | 8/2005 |
| JP | 2006-120981 A | | 5/2006 |
| JP | 2007-243989 A | | 9/2007 |
| JP | 2015-204531 A | | 11/2015 |

OTHER PUBLICATIONS

Official Communication issued in Japanese Patent Application No. 2018-525190, dated Mar. 24, 2020.

Official Communication issued in Japanese Patent Application No. 2018-525190, dated Jun. 9, 2020.

Official Communication issued in corresponding Japanese Patent Application No. 2018-525190, dated Sep. 8, 2020.

* cited by examiner

ELASTIC WAVE DEVICE

CROSS REFERENCE TO RELATED APPLICATIONS

This application claims the benefit of priority to Japanese Patent Application No. 2016-129077 filed on Jun. 29, 2016 and is a Continuation Application of PCT Application No. PCT/JP2017/023651 filed on Jun. 27, 2017. The entire contents of each application are hereby incorporated herein by reference.

BACKGROUND OF THE INVENTION

1. Field of the Invention

The present invention relates to an elastic wave device.

2. Description of the Related Art

Elastic wave devices have been used as high-frequency signal transmitting/receiving components in portable terminal devices or the like. In some cases, large power is applied to the elastic wave device. In such a case, heat is generated in a piezoelectric substrate or a functional electrode (IDT electrode). If the generated heat remains in the elastic wave device, the efficiency of output power with respect to input power may decrease. In addition, the electrical characteristics of the elastic wave device may deteriorate. Furthermore, the functional electrode of the elastic wave device may be broken.

Therefore, countermeasures against heat are provided in existing elastic wave devices. Specifically, in an elastic wave device, a space (through hole) for dissipating heat is provided, or a path for dissipating heat is provided.

Japanese Unexamined Patent Application Publication No. 2005-217670 discloses an elastic wave device in which a countermeasure against heat is provided.

FIG. 9 shows an elastic wave device 1100 disclosed in Japanese Unexamined Patent Application Publication No. 2005-217670.

In the elastic wave device 1100, an elastic wave element 103 is mounted on a substrate (support base) by bumps 102. The elastic wave element 103 includes a functional electrode (IDT electrode: not shown) formed on a lower main surface thereof. An exterior resin layer (protective member) 104 is formed on the substrate 101 including the elastic wave element 103 mounted thereon.

In the elastic wave device 1100, through holes 105 are formed in the elastic wave element 103 so as to penetrate through both main surfaces thereof. Good heat conductors 106 are formed on the upper main surface and the lower main surface of the elastic wave element 103 so as to close the through holes 105.

The through holes 105 and the good heat conductors 106 are provided for dissipating heat generated in the functional electrode. In addition, the purpose of closing the through holes 105 at both sides by the good heat conductors 106 is to prevent outside air (particularly, moisture) from entering the space, in which the functional electrode is formed, through the through holes 105 and corroding the functional electrode to cause a breakdown.

Japanese Unexamined Patent Application Publication No. 2006-120981 also discloses another elastic wave device in which a countermeasure against heat generation is provided.

FIG. 10 shows an elastic wave device 1200 disclosed in Japanese Unexamined Patent Application Publication No. 2006-120981.

In the elastic wave device (electronic component) 1200, an elastic wave element (electronic element) 202 is mounted on a substrate (base) 201. The elastic wave element 202 includes a functional electrode (comb-shaped electrode, or the like: not shown) formed on a lower main surface thereof.

The elastic wave element 202 includes a plurality of metal layers 203 formed on an upper main surface thereof from Cr or the like, and metal projections 204 are further formed on the respective metal layers 203 by bump plating or the like.

In the elastic wave device 1200, a sealing material 205 made of a resin is formed on the elastic wave element 202, including spaces between the metal projections 204 adjacent to each other. Furthermore, a metal film 206 is formed on the sealing material 205. The metal film 206 is electrically connected to outer electrodes (connection portions) 207 formed on the lower main surface of the substrate 201 and the elastic wave element 202 is shielded.

In the elastic wave device 1200, the metal projections 204, which are provided on the upper main surface of the elastic wave element 202, and the metal film 206 are intended to dissipate heat (Joule heat) generated in the functional electrode of the elastic wave element 202.

The elastic wave device 1100 disclosed in Japanese Unexamined Patent Application Publication No. 2005-217670 includes the through holes 105 and the good heat conductors 106, such that a countermeasure for dissipating heat generated in the functional electrode (IDT electrode) is provided. However, in the elastic wave device 1100, a wiring electrode at the IDT formation surface side and a high thermal conductivity member on the back surface are merely connected to each other by a via, and sufficient shielding is not achieved.

In some cases, the electrical characteristics (Isolation characteristics, attenuation characteristics, etc.) of the elastic wave element of the elastic wave device are deteriorated by external noise. In addition, in the case in which the elastic wave device includes a plurality of elastic wave elements, the electrical characteristics of a certain elastic wave element are deteriorated by noise generated by another elastic wave element, in some cases. In the case in which a plurality of functional electrodes are formed on the elastic wave element of the elastic wave device, the electrical characteristics of a certain functional electrode are deteriorated by noise generated by another functional electrode, in some cases.

In the elastic wave device 1100 disclosed in Japanese Unexamined Patent Application Publication No. 2005-217670, the elastic wave element 103 is not shielded, and thus there is a possibility that the electrical characteristics are deteriorated by external noise. In addition, there is a possibility that noise is radiated to the outside.

In the elastic wave device 1200 disclosed in Japanese Unexamined Patent Application Publication No. 2006-120981, the countermeasure is provided in which heat generated in the functional electrode (IDT electrode) formed on the lower main surface of the elastic wave element 202 is dissipated by the metal projections 204, which are provided on the upper main surface of the elastic wave element 202, and the metal film 206.

However, in the elastic wave device 1200, whereas the functional electrode, which generates heat, is provided on the lower main surface of the elastic wave element 202, the metal projections 204, which are heat dissipating elements, are provided on the upper main surface of the elastic wave element 202, that is, the heat generating portion and the heat dissipating portion are formed on different main surfaces and away from each other. Therefore, in some cases, it is not possible to sufficiently dissipate heat generated in the functional electrode. That is, in the elastic wave device 1200, heat dissipation by the metal projections 204 and the metal film 206 is insufficient, so that the electrical characteristics of the elastic wave device 1200 are deteriorated by heat generated in the functional electrode, in some cases.

SUMMARY OF THE INVENTION

Preferred embodiments of the present invention provide elastic wave devices in each of which a deterioration of electrical characteristics or an occurrence of a breakdown due to heat generation is reduced or prevented, and a deterioration of electrical characteristics due to noise is reduced or prevented.

An elastic wave device according to a preferred embodiment of the present invention includes a substrate and at least one elastic wave element mounted on a first main surface of the substrate, wherein the substrate includes an outer electrode provided on a second main surface thereof and a first mounting electrode provided on the first main surface thereof; the elastic wave element includes a piezoelectric substrate, and a ground terminal is provided on one main surface of the piezoelectric substrate; the ground terminal is connected to the first mounting electrode; a high-thermal-conductivity conductor layer having a higher thermal conductivity than the piezoelectric substrate is provided on another main surface of the piezoelectric substrate; a conductor via penetrates between both main surfaces of the piezoelectric substrate; and the high-thermal-conductivity conductor layer and the ground terminal are connected to each other via the conductor via. The high-thermal-conductivity conductor layer and the ground terminal are electrically and thermally connected to each other by the conductor via.

The at least one elastic wave element may be a duplexer or a multiplexer provided in the one piezoelectric substrate, and a transmission functional electrode and a reception functional electrode may be provided as functional electrodes on one main surface of the elastic wave element.

In this case, the high-thermal-conductivity conductor layer preferably includes a region separated into a region corresponding to the transmission functional electrode and a region corresponding to the reception functional electrode, in the other main surface of the piezoelectric substrate. Generally, in an elastic wave element that is a duplexer or a multiplexer, large power is applied to a transmission functional electrode, and thus, heat is considerably generated in the transmission functional electrode in many cases. On the other hand, large power is not applied to a reception functional electrode, such that not much heat is generated in the reception functional electrode. When the heat generated in the transmission functional electrode is transmitted to the reception functional electrode, a temperature shift occurs in the electrical characteristics of a reception filter, and thus, there is a possibility that the electrical characteristics of the reception filter deteriorate. Therefore, it is preferable that the high-thermal-conductivity conductor layer is separated into the region corresponding to the transmission functional electrode and the region corresponding to the reception functional electrode, and the heat generated in the transmission functional electrode is reduced or prevented from being transmitted to the reception functional electrode via the high-thermal-conductivity conductor layer, such that it is possible to reduce or prevent the function of the reception functional electrode from deteriorating and to reduce or prevent the electrical characteristics of the reception filter from deteriorating.

In this case, furthermore, the high-thermal-conductivity conductor layer provided in the region corresponding to the transmission functional electrode and the ground terminal provided near the transmission functional electrode are preferably connected to each other by the conductor via. As described above, generally, in an elastic wave element that is a duplexer or a multiplexer, large power is applied to a transmission functional electrode, and thus, heat is considerably generated in the transmission functional electrode in many cases. Therefore, it is preferable for the ground terminal provided near the transmission functional electrode and the high-thermal-conductivity conductor layer to be connected to each other by the conductor via as described above, since it is possible to efficiently dissipate heat generated near the transmission functional electrode, by the conductor via.

In addition, the high-thermal-conductivity conductor layer provided in the region corresponding to the reception functional electrode and the ground terminal provided near the reception functional electrode are preferably connected to each other by the conductor via. Generally, in an elastic wave element that is a duplexer or a multiplexer, since the SN ratio of a reception signal is lower than that of a transmission signal, electrical characteristics deteriorate more greatly when a reception functional electrode (reception filter) receives noise, than when a transmission functional electrode (transmission filter) receives noise, which becomes a serious problem. Therefore, it is preferable for the high-thermal-conductivity conductor layer provided in the region corresponding to the reception functional electrode and the ground terminal provided near the reception functional electrode to be connected to each other by the conductor via, since it is possible to connect the high-thermal-conductivity conductor layer provided in the region corresponding to the reception functional electrode to ground and to perform shielding, and further, it is possible to effectively protect the reception functional electrode (reception filter) from noise to reduce or prevent deterioration of electrical characteristics due to noise.

In the case in which the elastic wave element is a duplexer or a multiplexer, the high-thermal-conductivity conductor layer may also be defined by one continuous conductor layer covering a region corresponding to the transmission functional electrode and a region corresponding to the reception functional electrode, of the other main surface of the piezoelectric substrate. In this case, it may be preferable for the high-thermal-conductivity conductor layer and the ground terminal provided near the reception functional electrode to be connected to each other by the conductor via. That is, in some cases, in a transmission filter, due to the design of the filter, the ground terminal of the filter is not directly connected to ground, but is connected to ground with an inductor disposed therebetween. In this case, if the high-thermal-conductivity conductor layer and the ground terminal provided near the transmission functional electrode are connected to each other by the conductor via, it becomes impossible to improve electrical characteristics by inserting an inductor between the ground terminal and ground. Therefore, in this case, it is preferable for the high-thermal-conductivity conductor layer and the ground terminal provided near the reception functional electrode to be connected to each other by the conductor via and the high-thermal-conductivity conductor layer provides shielding.

In elastic wave devices according to preferred embodiments of the present invention, since the conductor via penetrates between both main surfaces of the elastic wave element, and the high-thermal-conductivity conductor layer and the ground terminal are electrically connected to each other by the conductor via, a deterioration of electrical characteristics and/or an occurrence of a breakdown due to heat generation is reduced or prevented, and a deterioration of electrical characteristics due to noise is reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
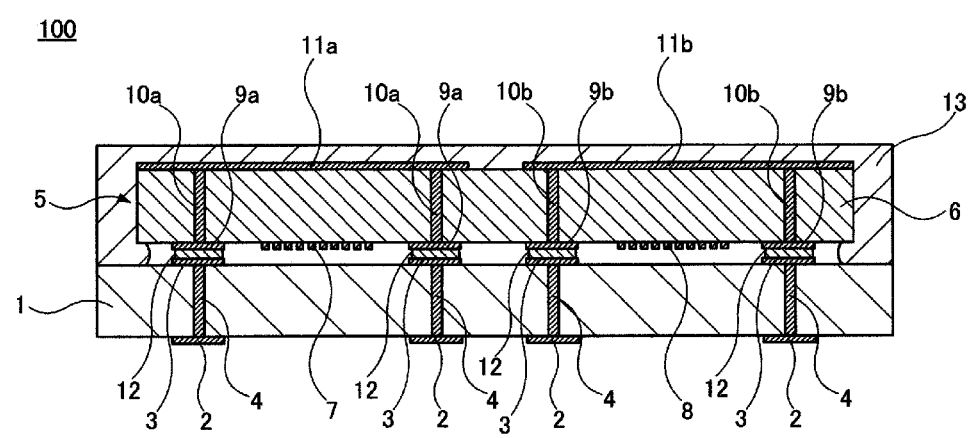
FIG. 1 is a cross-sectional view showing an elastic wave device 100 according to a first preferred embodiment of the present invention.

Hereinafter, preferred embodiments of the present invention will be described with reference to the accompanying drawings.

Each preferred embodiment described below exemplifies a preferred embodiment of the present invention, and the present invention is not limited to the contents of the preferred embodiments. In addition, the contents described in different preferred embodiments may be combined and used, and the elements and features in that case are also included in the present invention. The drawings are provided to help the understanding of the description, and there are cases in which the ratios of dimensions of the illustrated elements or the ratios of dimensions between the elements do not correspond to the ratios of dimensions of those described in the description. In addition, for example, there are cases in which the elements described in the description are omitted in the drawings, or the elements are shown in a reduced number.

First Preferred Embodiment

FIG. 1 shows an elastic wave device 100 according to a first preferred embodiment of the present invention.

The elastic wave device 100 includes a substrate 1. For example, a ceramic material is preferably used for the substrate 1. However, the material of the substrate 1 is not particularly limited, and the substrate 1 may be produced from a glass ceramic material, a resin, or other suitable material, for example, instead of the ceramic material. Alternatively, the substrate 1 may have a multilayer structure. In such a case, for example, a high acoustic-velocity support substrate, a low acoustic-velocity film, and a piezoelectric layer are preferably laminated in that order. A high acoustic-velocity support substrate may include a high acoustic-velocity film and a support substrate.

Outer electrodes 2 are provided on one main surface (the lower main surface in the drawing) of the substrate 1. In addition, first mounting electrodes 3 and second mounting electrodes (not shown) are provided on the other main surface (the upper main surface in the drawing) of the substrate 1. In the present preferred embodiment, the first mounting electrodes are ground mounting electrodes used as ground, and the second mounting electrodes are functional mounting electrodes used to transmit signals. FIG. 1 is a cross-sectional view showing a portion of the substrate 1 in which the second mounting electrodes are not provided.

The structures, the materials, and the forming methods for the outer electrodes 2, the first mounting electrodes 3, and the second mounting electrodes are not particularly limited. For example, each electrode may preferably have a multilayer structure including a Cu layer defining a first layer by baking a conductive paste, an Ni layer defining a second layer by plating, a Pd layer defining a third layer by plating, and an Au layer defining a fourth layer by plating.

Via conductors 4 penetrate between both main surfaces of the substrate 1. The via conductors 4 connect the first mounting electrodes 3 to the outer electrodes 2. In addition, the via conductors 4 connect the second mounting electrodes (not shown) to the outer electrodes 2. The material of the via conductors 4 is not particularly limited, but may preferably be Cu, for example. In the present preferred embodiment, the substrate 1 is preferably a single-layer substrate, but a multilayer substrate may be used instead of the single-layer substrate. In the multiplayer substrate, interlayer electrodes may be provided between layers.

The elastic wave device 100 includes an elastic wave element 5. In the present preferred embodiment, the elastic wave element 5 preferably defines a duplexer, for example. However, the elastic wave element 5 is not limited to a duplexer, and may be a triplexer or a multiplexer having additional functions.

The elastic wave element 5 includes a piezoelectric substrate 6. The material of the piezoelectric substrate 6 is not particularly limited, but, for example, a $LiNbO_3$ substrate, a $LiTaO_3$ substrate, a crystal substrate, or other suitable material may preferably be used.

In the elastic wave element 5, a transmission functional electrode 7 having an IDT (Inter Digital Transducer) structure and a reception functional electrode 8 similarly having an IDT structure are provided on one main surface (the lower main surface in the drawing) of the piezoelectric substrate 6. The details of the transmission functional electrode 7 and the reception functional electrode 8 are not particularly limited, and, for example, a plurality of resonators may be provided as each electrode and connected to define a filter (a ladder filter, or other suitable filter), for example.

In the elastic wave element 5, functional terminals (not shown) and ground terminals 9a and 9b are provided on the one main surface (the lower main surface in the drawing) of the piezoelectric substrate 6. FIG. 1 is a cross-sectional view showing a portion of the elastic wave element 5 in which the functional terminals are not provided.

The functional terminals are input terminals and output terminals for the transmission functional electrode 7 and the reception functional electrode 8, or other suitable terminals.

The ground terminals 9a and 9b are ground terminals for the transmission functional electrode 7 and the reception functional electrode 8. However, a dedicated ground terminal that is not connected to the transmission functional electrode 7 or the reception functional electrode 8 may be provided.

The ground terminals 9a and 9b are divided into ground terminals 9a provided near the transmission functional electrode 7 on the one main surface of the piezoelectric substrate 6, and ground terminals 9b provided near the reception functional electrode 8 on the one main surface of the piezoelectric substrate 6. The ground terminals 9a being provided near the transmission functional electrode 7 means that the ground terminals 9a are closer to the transmission functional electrode 7 than to the reception functional electrode 8. In addition, the ground terminals 9b being provided near the reception functional electrode 8 means that the ground terminals 9b are closer to the reception functional electrode 8 than to the transmission functional electrode 7.

The transmission functional electrode 7, the reception functional electrode 8, the functional terminals, and the ground terminals 9a and 9b are preferably made of, for example, a metal selected from Pt, Au, Ag, Cu, Ni, W, Ta, Fe, Cr, Al, and Pd, or an alloy including one or more of these metals. The transmission functional electrode 7, the reception functional electrode 8, the functional terminals, and the ground terminals 9a and 9b may have a multilayer structure including a plurality of the metals and alloys described above.

In the elastic wave element 5, via conductors 10a and 10b penetrate between both main surfaces of the piezoelectric substrate 6. Each via conductor 10a is connected at one end thereof to the ground terminal 9a, which is provided near the transmission functional electrode 7. Each via conductor 10b is connected at one end thereof to the ground terminal 9b, which is provided near the reception functional electrode 8.

In the elastic wave element 5, high-thermal-conductivity conductor layers 11a and 11b are provided on the other main surface (the upper main surface in the drawing) of the piezoelectric substrate 6. The high-thermal-conductivity conductor layer 11a and the high-thermal-conductivity conductor layer 11b are separated from each other. The high-thermal-conductivity conductor layer 11a is provided in a region corresponding to the transmission functional electrode 7, and is connected to the ground terminals 9a, which are provided near the transmission functional electrode 7, by the via conductors 10a. In addition, the high-thermal-conductivity conductor layer 11b is provided in a region corresponding to the reception functional electrode 8, and is connected to the ground terminals 9b, which are provided near the reception functional electrode 8, via the via conductors 10b. The high-thermal-conductivity conductor layer 11a being provided in the region corresponding to the transmission functional electrode 7 means that the high-thermal-conductivity conductor layer 11a overlaps the transmission functional electrode 7 when the main surface of the piezoelectric substrate 6 is seen in a plan view. However, the high-thermal-conductivity conductor layer 11a and the transmission functional electrode 7 only need to at least partially overlap each other. In addition, the high-thermal-conductivity conductor layer 11b being provided in the region corresponding to the reception functional electrode 8 means that the high-thermal-conductivity conductor layer 11b overlaps the reception functional electrode 8 when the main surface of the piezoelectric substrate 6 is seen in a plan view. However, the high-thermal-conductivity conductor layer 11b and the reception functional electrode 8 only need to at least partially overlap each other.

The high-thermal-conductivity conductor layers 11a and 11b are preferably made of, for example, aluminum. However, the high-thermal-conductivity conductor layers 11a and 11b may be made of gold, copper, or other suitable material, instead of aluminum. In addition, the high-thermal-conductivity conductor layers 11a and 11b may have a multilayer structure including titanium and copper, or other suitable material, instead of the single metal layer. The "high thermal conductivity in the high-thermal-conductivity conductor layers 11a and 11b means that the thermal conductivity is higher than that of the material of the piezoelectric substrate 6.

The elastic wave element 5 is flip-chip mounted on the substrate 1. More specifically, the first mounting electrode 3 and the ground terminals 9a and 9b, and the second mounting electrodes (not shown) and the functional terminals (not shown), are connected to each other by bumps 12. The bumps 12 are preferably made of, for example, Au.

An exterior resin layer 13 is provided on the substrate 1 with the elastic wave element 5 mounted thereon. The material of the exterior resin layer 13 is not particularly limited, but, for example, an epoxy resin may preferably be used. However, for the exterior resin layer 13, a thermoplastic resin, for example, an acrylic resin or other suitable resin may be also used, instead of a thermosetting resin, for example, an epoxy resin.

The exterior resin layer 13 is not provided in a space on the piezoelectric substrate 6 in which the transmission functional electrode 7 and the reception functional electrode 8 are provided. That is, the interval between the other main surface (the upper main surface in the drawing) of the substrate 1 and the one main surface (the lower main surface in the drawing) of the piezoelectric substrate 6 is narrow, and thus, the resin does not enter the interval and the exterior resin layer 13 is not provided in the interval. In order to ensure a space at this portion, an annular projection (dam) to prevent inflow of the resin may be provided on at least one of the other main surface of the substrate 1 and the one main surface of the piezoelectric substrate 6.

FIG. 2A to FIG. 4K show a non-limiting example of a method for producing the elastic wave device 100.

Figure 2A:
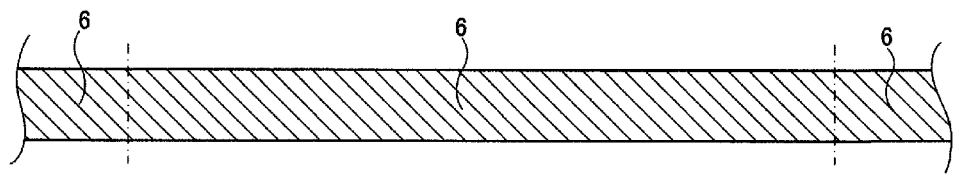
FIGS. 2A to 2D are each a cross-sectional view showing a step performed in an example of a method for producing the elastic wave device 100.

First, as shown in FIG. 2A, the piezoelectric substrate 6 is prepared. FIG. 2A shows a mother board in which a plurality of piezoelectric substrates 6 are disposed in a matrix manner, for collectively producing elastic wave devices 100.

Figure 2B:
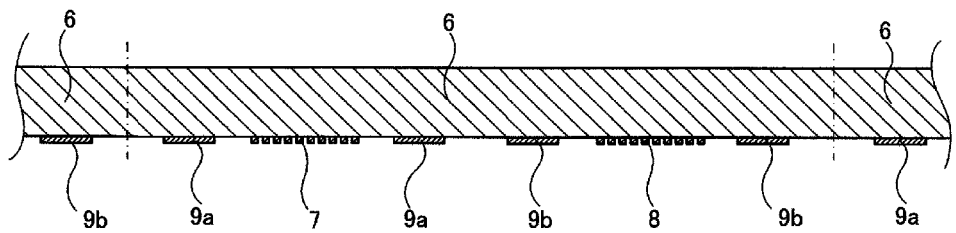

Next, as shown in FIG. 2B, the transmission functional electrode 7, the reception functional electrode 8, the functional terminals (not shown), and the ground terminals 9a and 9b are formed on the one main surface (the lower main surface in the drawing) of each piezoelectric substrate 6 by, for example, photolithography.

Figure 2C:
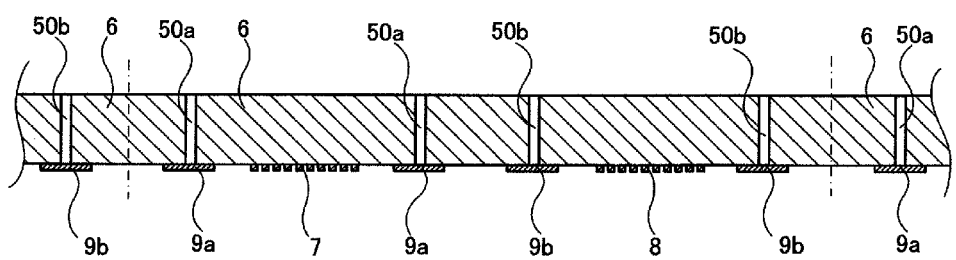

Next, as shown in FIG. 2C, holes 50a and 50b are formed so as to penetrate between both main surfaces of each piezoelectric substrate 6, by laser machining, blast machining, or ultrasonic machining, for example. The holes 50a are formed so as to reach the ground terminals 9a, which are formed near the transmission functional electrode 7. The holes 50b are formed so as to reach the ground terminals 9b, which are formed near the reception functional electrode 8.

Figure 2D:
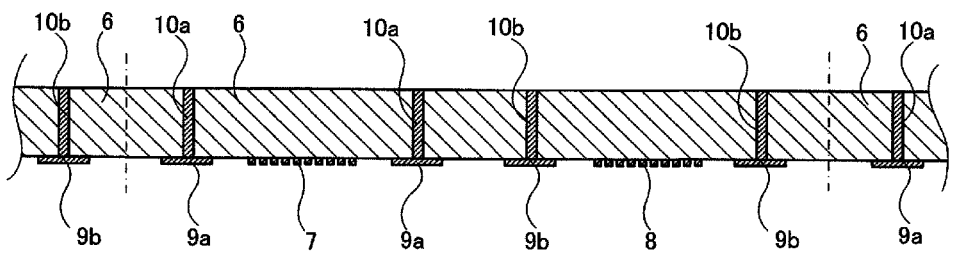

Next, as shown in FIG. 2D, electrodes are formed in the through holes 50a and 50b by a sputtering method or a vapor deposition method, for example. In addition, in some cases, the interiors of the through holes are filled with electrodes using Cu or Ni formed by electrolytic plating, for example, to form the via conductors 10a and 10b, which penetrate between both main surfaces of each piezoelectric substrate 6.

Figure 3E:
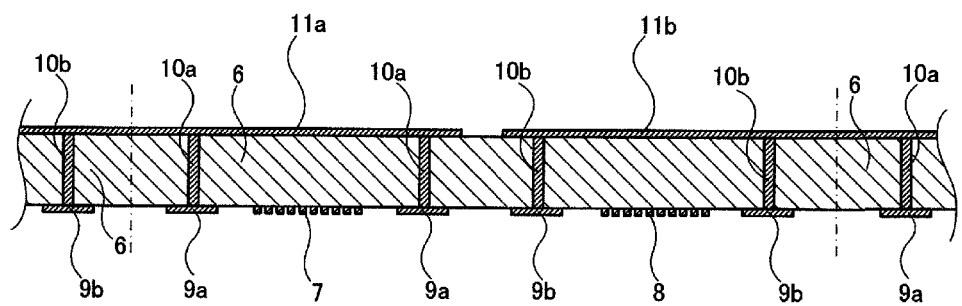
FIGS. 3E to 3H are each a cross-sectional view showing a step performed in the example of the method for producing the elastic wave device 100, subsequent to FIG. 2D.

Next, as shown in FIG. 3E, the high-thermal-conductivity conductor layers 11a and 11b are formed on the other main surface (the upper main surface in the drawing) of each piezoelectric substrate 6 by using photolithography.

Figure 3F:
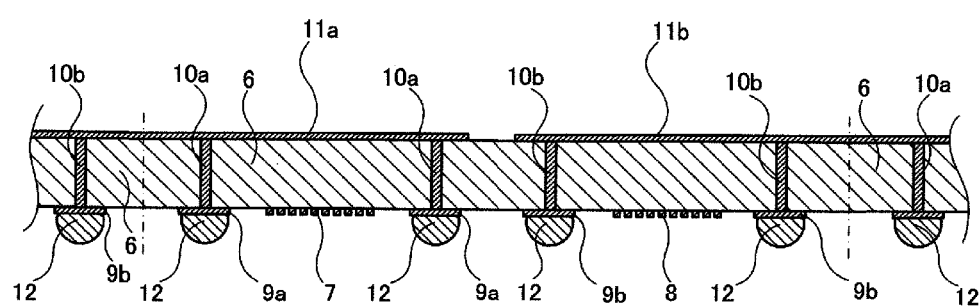

Next, as shown in FIG. 3F, the bumps 12 are formed on the surfaces of the functional terminals (not shown) and the ground terminals 9a and 9b, for example, by a stud bump method.

Figure 3G:
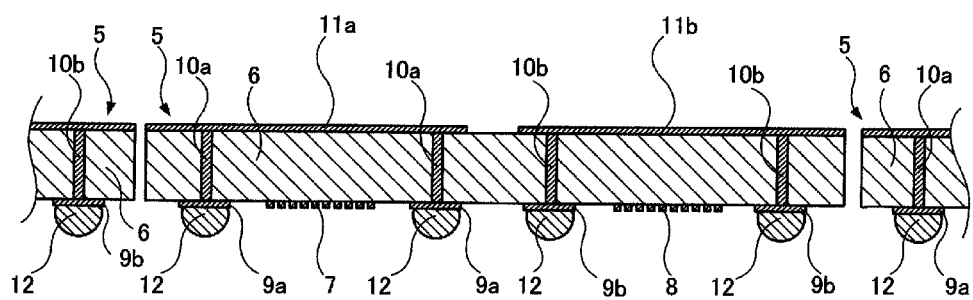

Next, as shown in FIG. 3G, the piezoelectric substrates 6 are individually separated from each other to complete elastic wave elements 5.

Figure 3H:
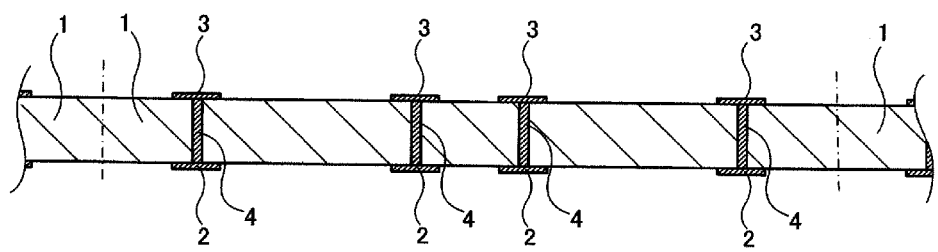

Next, as shown in FIG. 3H, in advance, substrates 1 are prepared in each of which the outer electrodes 2 are formed on the one main surface (the lower main surface in the drawing), the first mounting electrodes 3 and the second mounting electrodes (not shown) are formed on the other main surface (the upper main surface in the drawing), and the via conductors 4 are formed so as to penetrate between both main surfaces. The substrates 1 having such a structure may be produced by a substrate production method that is generally and widely used. FIG. 3H shows a mother board in which a plurality of substrates 1 are disposed in a matrix manner, for collectively producing elastic wave devices 100.

Figure 4I:
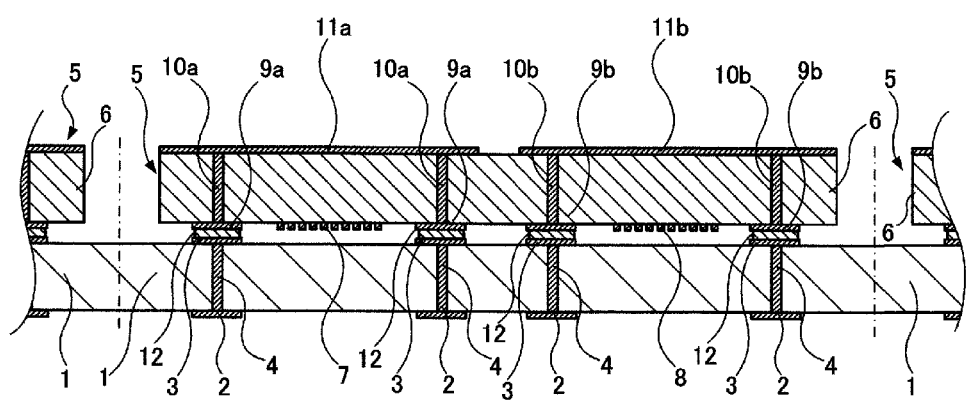
FIGS. 4I to 4K are each a cross-sectional view showing a step performed in the example of the method for producing the elastic wave device 100, subsequent to FIG. 3H.

Next, as shown in FIG. 4I, the elastic wave elements 5 are flip-chip mounted on the substrates 1 by the bumps 12. More specifically, after the elastic wave elements 5 are placed in mount regions of the substrates 1, the elastic wave elements 5 are pressed toward the substrates 1 while the bumps 12, the first mounting electrodes 3, and the second mounting electrodes are being heated, and ultrasonic waves are applied, such that the bumps 12 and the first mounting electrodes 3 are joined to each other and the bumps 12 and the second mounting electrodes are joined to each other.

Figure 4J:
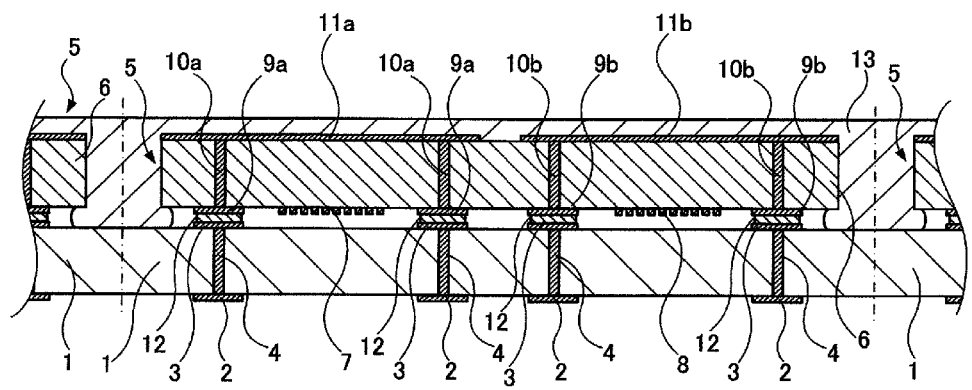

Next, as shown in FIG. 4J, the exterior resin layer 13 is formed on each substrate 1 with the elastic wave element 5 mounted thereon, for example, by molding a resin.

Figure 4K:
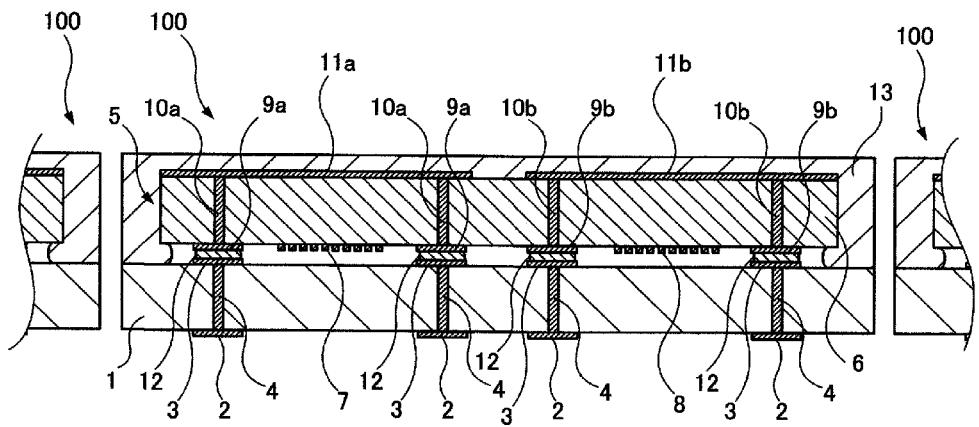

Finally, as shown in FIG. 4K, the elastic wave devices 100 are individually separated from each other to complete the elastic wave devices 100.

In the elastic wave device 100 according to the present preferred embodiment, it is possible to efficiently dissipate heat generated in the transmission functional electrode 7 or the reception functional electrode 8, via the ground terminals 9a and 9b, the via conductor 10a or 10b, the high-thermal-conductivity conductor layer 11a or 11b, and other structures. Therefore, in the elastic wave device 100, a deterioration of characteristics or an occurrence of a breakdown due to heat generation is reduced or prevented.

As described above, in the elastic wave element 5 such as a duplexer, the transmission functional electrode 7 generates a larger amount of heat than the reception functional electrode 8 in many cases. In the elastic wave device 100 according to the present preferred embodiment, since the high-thermal-conductivity conductor layer 11a and the high-thermal-conductivity conductor layer 11b are separated from each other, heat generated in the transmission functional electrode 7 is prevented from being transmitted via the high-thermal-conductivity conductor layers 11a and 11b to the reception functional electrode 8. That is, in the elastic wave device 100, a countermeasure is provided such that heat generated in the transmission functional electrode 7 does not deterioration the function of the reception functional electrode 8 (the electrical characteristics of a reception filter).

In the elastic wave device 100 according to the present preferred embodiment, the high-thermal-conductivity conductor layer 11a is connected to ground by the via conductors 10a, the ground terminals 9a, the bumps 12, and the first mounting electrodes 3, and the elastic wave element 5 is shielded. Similarly, the high-thermal-conductivity conductor layer 11b is connected to ground by the via conductors 10b, the ground terminals 9b, the bumps 12, and the first mounting electrodes 3, and the elastic wave element 5 is shielded. Therefore, in the elastic wave device 100, the high-thermal-conductivity conductor layers 11a and 11b block external noise or noise generated by an adjacent functional electrode, and reduce or prevent deterioration of the function of the transmission functional electrode 7 (the electrical characteristics of a transmission filter) or the function of the reception functional electrode 8 (the electrical characteristics of the reception filter) due to such noise. In addition, in the elastic wave device 100, the high-thermal-conductivity conductor layers 11a and 11b also reduce or prevent noise, generated by the transmission functional electrode 7 or the reception functional electrode 8, from being radiated to the outside.

Second Preferred Embodiment

Figure 5:
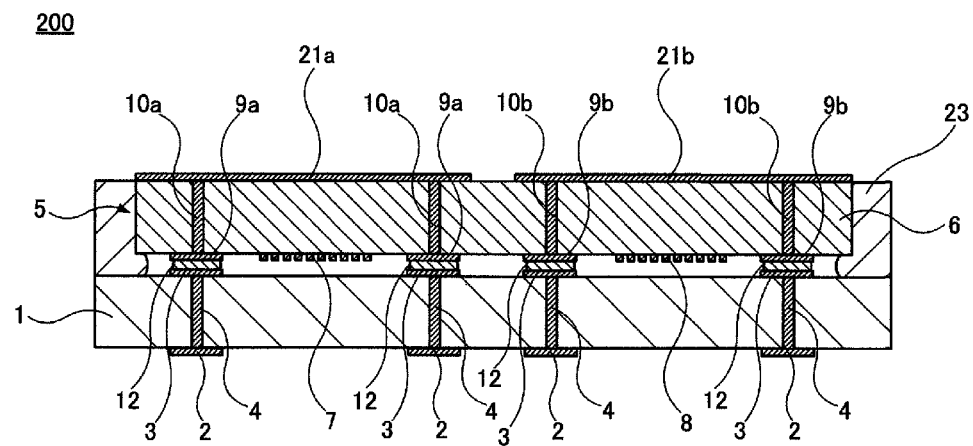
FIG. 5 is a cross-sectional view showing an elastic wave device 200 according to a second preferred embodiment of the present invention.

FIG. 5 shows an elastic wave device 200 according to a second preferred embodiment of the present invention.

Specifically, FIG. 5 is a cross-sectional view of the elastic wave device 200.

In the elastic wave device 200, the configuration of the elastic wave device 100 according to the first preferred embodiment is partially changed. Specifically, in the elastic wave device 100, the high-thermal-conductivity conductor layers 11a and 11b are buried in the exterior resin layer 13. In the elastic wave device 200, high-thermal-conductivity conductor layers 21a and 21b are externally exposed from the upper main surface of an exterior resin layer 23 by reducing the thickness of the exterior resin layer 23. The remaining configuration of the elastic wave device 200 is the same or substantially the same as that of the elastic wave device 100.

The high-thermal-conductivity conductor layers 21a and 21b of the elastic wave device 200 have a better heat dissipating effect than the high-thermal-conductivity conductor layers 11a and 11b of the elastic wave device 100, and thus, deterioration of characteristics or occurrence of a breakdown due to heat generation is more securely reduced or prevented.

Third Preferred Embodiment

Figure 6:
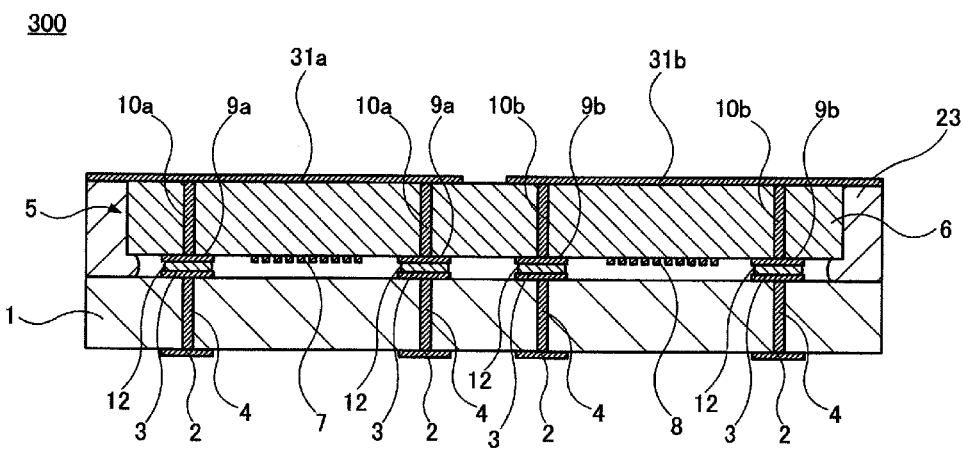
FIG. 6 is a cross-sectional view showing an elastic wave device 300 according to a third preferred embodiment of the present invention.

FIG. 6 shows an elastic wave device 300 according to a third preferred embodiment of the present invention. Specifically, FIG. 6 is a cross-sectional view of the elastic wave device 300.

In the elastic wave device 300, the configuration of the elastic wave device 200 according to the second preferred embodiment is partially changed. Specifically, in the elastic wave device 300, the areas of the high-thermal-conductivity conductor layers 21a and 21b of the elastic wave device 200 are increased and the high-thermal-conductivity conductor layers 21a and 21b are replaced by high-thermal-conductivity conductor layers 31a and 31b, respectively. The high-thermal-conductivity conductor layer 31a is extended leftward in FIG. 6 to the upper left edge of the exterior resin layer 23. Similarly, the high-thermal-conductivity conductor layer 31b is extended rightward in FIG. 6 to the upper right edge of the exterior resin layer 23.

In the elastic wave device 300, the high-thermal-conductivity conductor layers 31a and 31b each have increased areas, and thus, the heat-dissipating effect and the shielding effect by the high-thermal-conductivity conductor layers 31a and 31b are further improved. For the elastic wave device 300, it is necessary to change the above-described production method, and it is necessary to form the high-thermal-conductivity conductor layers 31a and 31b after the exterior resin layer 23 is formed on the substrate 1 with the elastic wave element 5 mounted thereon.

Fourth Preferred Embodiment

Figure 7:
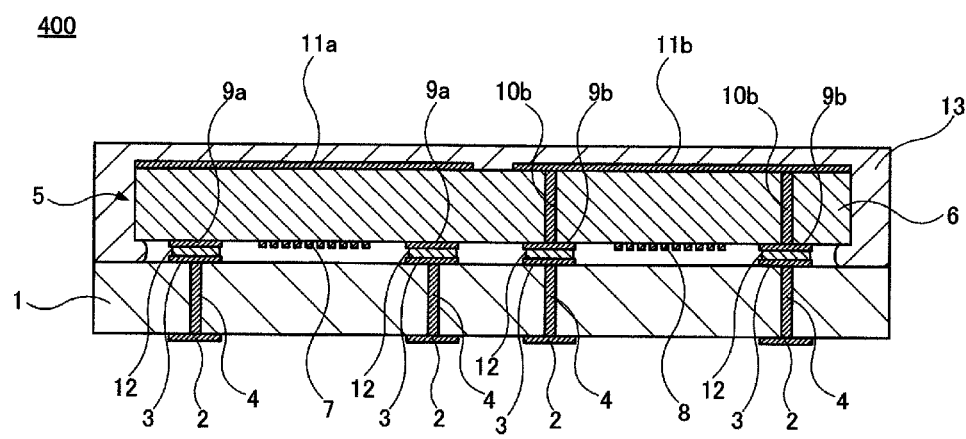
FIG. 7 is a cross-sectional view showing an elastic wave device 400 according to a fourth preferred embodiment of the present invention.

FIG. 7 shows an elastic wave device 400 according to a fourth preferred embodiment of the present invention.

Specifically, FIG. 7 is a cross-sectional view of the elastic wave device 400.

In the elastic wave device 400, the configuration of the elastic wave device 100 according to the first preferred embodiment is partially changed. Specifically, in the elastic wave device 400, the via conductors 10a, which penetrate between both main surfaces of the piezoelectric substrate 6 and connect the high-thermal-conductivity conductor layer 11a to the ground terminals 9a in the elastic wave device 100, are omitted. Therefore, in the elastic wave device 400, the high-thermal-conductivity conductor layer 11a is not connected to the ground terminals 9a and the transmission functional electrode 7 is not shielded. The remaining configuration of the elastic wave device 400 is the same or substantially the same as that of the elastic wave device 100. That is, the other high-thermal-conductivity conductor layer 11b is connected to the ground terminals by the via conductors 10b and the reception functional electrode 8 is shielded.

As described above, in some cases, in a transmission filter, due to the design of the filter, the ground terminal of the filter is not directly connected to ground, but is connected to ground with an inductor inserted therebetween. In such a case, when the high-thermal-conductivity conductor layer 11a and the ground terminals 9a are connected to each other via the via conductors 10a as in the elastic wave device 100, the characteristics of the filter vary in some cases. Therefore, in the elastic wave device 400, the via conductors 10a, which connect the high-thermal-conductivity conductor layer 11a to the ground terminals 9a in the elastic wave device 100, are omitted, so that the characteristics of the filter do not vary.

As described above, in an elastic wave element, such as a duplexer, a reception functional electrode is more greatly influenced by noise than a transmission functional electrode, which becomes a serious problem. In the elastic wave device 400, the reception functional electrode 8 is shielded and protected from noise by the high-thermal-conductivity conductor layer 11b, and thus, this problem is prevented.

Fifth Preferred Embodiment

Figure 8:
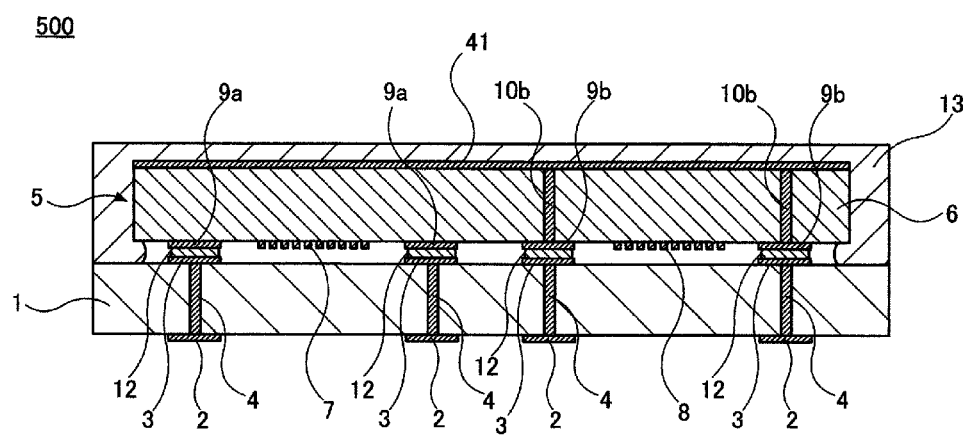
FIG. 8 is a cross-sectional view showing an elastic wave device 500 according to a fifth preferred embodiment of the present invention.
Figure 9:
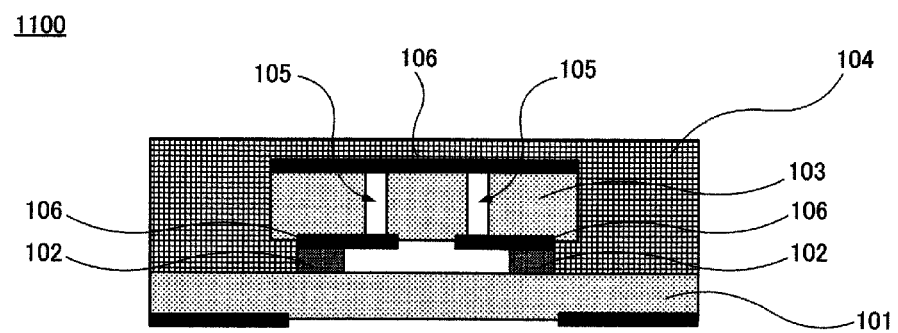
FIG. 9 is a cross-sectional view showing an elastic wave device 1100 disclosed in Japanese Unexamined Patent Application Publication No. 2005-217670.
Figure 10:
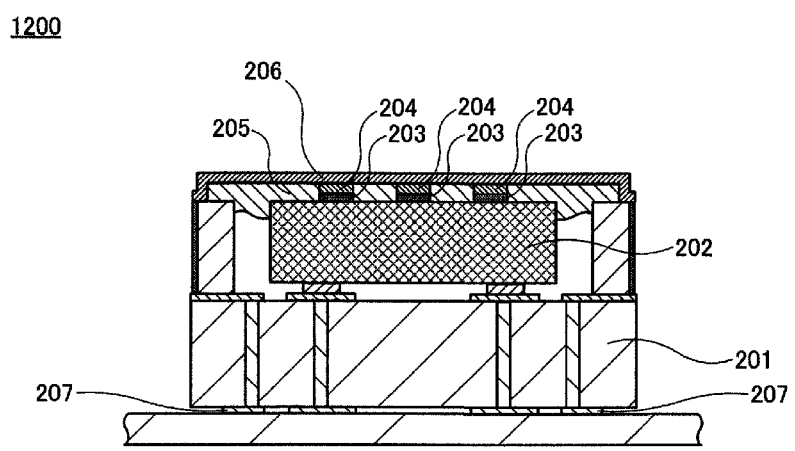
FIG. 10 is a cross-sectional view showing an elastic wave device 1200 disclosed in Japanese Unexamined Patent Application Publication No. 2006-120981.

FIG. 8 shows an elastic wave device 500 according to a fifth preferred embodiment of the present invention. Specifically, FIG. 8 is a cross-sectional view of the elastic wave device 500.

In the elastic wave device 500, the configuration of the elastic wave device 400 according to the fourth preferred embodiment is partially changed. Specifically, the high-thermal-conductivity conductor layer 11a and the high-thermal-conductivity conductor layer 11b are connected to each other to define one continuous high-thermal-conductivity conductor layer 41. That is, the high-thermal-conductivity conductor layer 41 covers the region corresponding to the transmission functional electrode 7 and the region corresponding to the reception functional electrode 8, of the upper main surface of the piezoelectric substrate 6. The high-thermal-conductivity conductor layer 41 is connected to ground by the via conductor 10b, which is provided near the reception functional electrode 8, the ground terminals 9b, and the bumps 12 and further by the first mounting electrodes 3, and the elastic wave element 5 is shielded. That is, the high-thermal-conductivity conductor layer for transmission and the high-thermal-conductivity conductor layer for reception may preferably be integrated with each other.

The high-thermal-conductivity conductor layer 41 covering the region corresponding to the transmission functional electrode 7 and the region corresponding to the reception functional electrode 8, of the upper main surface of the piezoelectric substrate 6 means that the high-thermal-conductivity conductor layer 41 overlaps the transmission functional electrode 7 and the reception functional electrode 8 when the main surface of the piezoelectric substrate 6 is seen in a plan view. However, the high-thermal-conductivity conductor layer 41 and the transmission functional electrode 7 only need to at least partially overlap each other, and the high-thermal-conductivity conductor layer 41 and the reception functional electrode 8 only need to at least partially overlap each other.

In the elastic wave device 500, not only the reception functional electrode 8 but also the transmission functional electrode 7 is protected from noise by the high-thermal-conductivity conductor layer 41.

The elastic wave devices 100, 200, 300, 400, and 500 according to the first to fifth preferred embodiments have been described above. However, the present invention is not limited to the above-described preferred embodiments, and various modifications may be made according to the gist of the present invention.

For example, in the elastic wave devices 100, 200, 300, 400, and 500, the elastic wave element 5 is preferably a duplexer including the transmission functional electrode 7 and the reception functional electrode 8, but is not limited to a duplexer.

The elastic wave element 5 may include a single functional electrode instead of the transmission functional electrode 7 and the reception functional electrode 8.

The elastic wave element 5 does not have to be a duplexer, and may be a triplexer or a multiplexer having more functions than the triplexer, for example.

The elastic wave element 5 may include a plurality of transmission functional electrodes or a plurality of reception functional electrodes, instead of the transmission functional electrode 7 and the reception functional electrode 8.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a substrate; and
at least one elastic wave element mounted on a first main surface of the substrate;
wherein
the substrate includes an outer electrode on a second main surface thereof and a first mounting electrode on the first main surface thereof;
the elastic wave element includes a piezoelectric substrate, and a ground terminal is provided on a first main surface of the piezoelectric substrate;
the ground terminal is connected to the first mounting electrode;
a high-thermal-conductivity conductor layer having a higher thermal conductivity than the piezoelectric substrate is provided on a second main surface of the piezoelectric substrate;
a conductor via penetrates between the first and second main surfaces of the piezoelectric substrate;
the high-thermal-conductivity conductor layer and the ground terminal are connected to each other by the conductor via;
the at least one elastic wave element is a duplexer or a multiplexer provided in or on the one piezoelectric substrate; and
a transmission functional electrode and a reception functional electrode are provided on the first main surface of the piezoelectric substrate.

2. The elastic wave device according to claim 1, wherein the high-thermal-conductivity conductor layer is separated into a region corresponding to the transmission functional electrode and a region corresponding to the reception functional electrode, on the second main surface of the piezoelectric substrate.

3. The elastic wave device according to claim 2, wherein the high-thermal-conductivity conductor layer in the region corresponding to the transmission functional electrode and a portion of the ground terminal near the transmission functional electrode are connected to each other by the conductor via.

4. The elastic wave device according to claim 2, wherein the high-thermal-conductivity conductor layer in the region corresponding to the reception functional electrode and a portion of the ground terminal near the reception functional electrode are connected to each other by the conductor via.

5. The elastic wave device according to claim 2, further comprising:
another conductor via; wherein
the high-thermal-conductivity conductor layer in the region corresponding to the reception functional electrode and a portion of the ground terminal near the reception functional electrode are connected to each other by the conductor via; and
the high-thermal-conductivity conductor layer in the region corresponding to the transmission functional electrode and a portion of the ground terminal near the transmission functional electrode are connected to each other by the another conductor via.

6. The elastic wave device according to claim 1, wherein the high-thermal-conductivity conductor layer is one continuous conductor layer covering a region corresponding to the transmission functional electrode and a region corresponding to the reception functional electrode, of the second main surface of the piezoelectric substrate.

7. The elastic wave device according to claim 6, wherein the high-thermal-conductivity conductor layer and a portion of the ground terminal at or adjacent to the reception functional electrode are electrically connected to each other by the conductor via.

8. The elastic wave device according to claim 1, wherein the substrate is made of a ceramic material.

9. The elastic wave device according to claim 1, wherein the conductor via is made of Cu.

10. The elastic wave device according to claim 1, wherein the piezoelectric substrate is a $LiNbO_3$ substrate, a $LiTaO_3$ substrate, or crystal substrate.

11. The elastic wave device according to claim 1, wherein the high-thermal-conductivity conductor layer is made of aluminum.

12. The elastic wave device according to claim 1, further comprising an exterior resin layer on the first main surface of the substrate.

13. The elastic wave device according to claim 12, wherein the exterior resin layer covers the elastic wave element and the high-thermal-conductivity conductor layer.

14. The elastic wave device according to claim 12, wherein the high-thermal-conductivity conductor layer is exposed on an upper surface of the exterior resin layer.

15. The elastic wave device according to claim 14, wherein the high-thermal-conductivity conductor layer extends to at least one edge of the upper surface of the exterior resin layer.

16. The elastic wave device according to claim 12, wherein the exterior resin layer is made of epoxy resin.

17. The elastic wave device according to claim 12, wherein the high-thermal-conductivity conductor layer extends to at least one edge of the exterior resin layer.

* * * * *